United States Patent [19]

Kleinknecht et al.

[11] 4,005,436
[45] Jan. 25, 1977

[54] APPARATUS FOR MAKING A RECORDING OF AN ELECTROSTATIC CHARGE PATTERN

[75] Inventors: Hans Peter Kleinknecht, Bergdietikon, Aargau; Helmut Gustav Kiess, Niedersteinmaur, Zurich, both of Switzerland

[73] Assignee: RCA Corporation, New York, N.Y.

[22] Filed: July 10, 1975

[21] Appl. No.: 594,868

[52] U.S. Cl. .............................. 346/153; 340/173 R
[51] Int. Cl.$^2$ ................ G11C 11/40; G03G 15/056
[58] Field of Search ............ 346/74 E, 74 ES, 74 S, 346/74 SB, 74 SC, 74 P; 340/173 R

[56] References Cited
UNITED STATES PATENTS

| | | | |
|---|---|---|---|
| 3,074,066 | 1/1963 | Conerly | 346/74 S |
| 3,233,244 | 2/1966 | Winterhalter | 346/74 E |
| 3,786,441 | 1/1974 | Engeler | 340/173 CR |
| 3,875,567 | 4/1974 | Yamazaki | 340/173 R |
| 3,886,530 | 5/1975 | Huber | 340/173 CR |

Primary Examiner—Jay P. Lucas
Attorney, Agent, or Firm—H. Christoffersen; R. P. Williams; T. H. Magee

[57] ABSTRACT

An electrostatic charge pattern is developed into a visual image with the aid of a current-sensitive recording element that is disposed against one face of an array of a plurality of field-effect devices. The charge pattern, on an electrically insulating film, is disposed against an opposite face of the array. An electrical circuit, connected to source and drain regions of the field-effect devices, causes current to flow in each of the devices in accordance with the intensity of each elemental portion of the charge pattern adjacent a respective channel region in each of the devices. The electrical current causes a color change in the recording element in accordance with the intensity of the current flowing therethrough.

7 Claims, 4 Drawing Figures

U.S. Patent  Jan. 25, 1977  Sheet 2 of 2  4,005,436
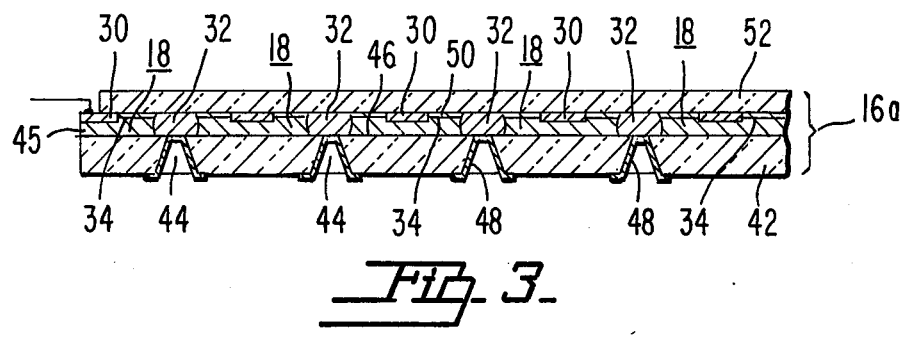
_Fig. 3_
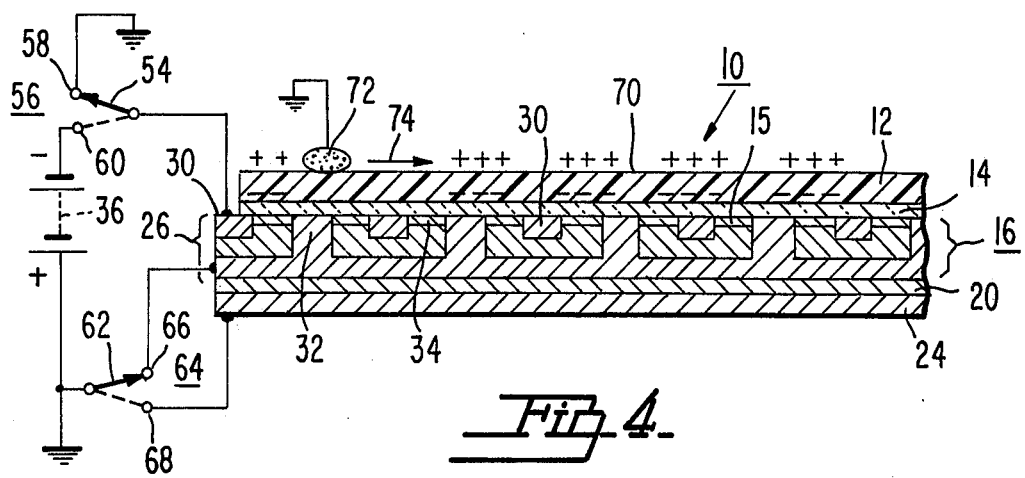
_Fig. 4_

APPARATUS FOR MAKING A RECORDING OF AN ELECTROSTATIC CHARGE PATTERN

This invention relates to apparatus for making a recording of an electrostatic charge pattern. The novel apparatus is useful in the electrophotographic arts for developing a latent electrostatic charge pattern with the aid of a current-sensitive recording element to render the charge pattern visible.

In conventional electrophotography, a latent electrostatic charge pattern is formed on an electrostatically charged photoconductor by exposing the charged photoconductor to a radiant image. The latent electrostatic charge pattern is rendered visible by developing it with electroscopic toner particles. Unless the latent electrostatic charge pattern is developed quickly, that is, within a matter of minutes, the charge pattern on the photoconductor decays rapidly, making satisfactory developing impossible.

It has been observed, as for example in U.S. Pat. No. 3,872,480 for Method of Electrostatic Recording on Electrically Insulating Films by Non-Wetting Electrically Conductive Liquids, issued on Mar. 18, 1975, that either monopolar or dipolar electrostatic charge patterns can be formed on electrically insulating films. These electrostatic charge patterns, unlike those on a photoconductor, can be preserved on the insulating films for a relatively much longer time, that is, for at least a few months, so that they may be developed (rendered visible) at the leisure of the operator.

One of the main factors limiting the sensitivity of the electrophotographic process is the relatively low amplification factor of the developing operation in conventional electrophotography. It is an object of the present invention to provide apparatus for developing an electrostatic charge pattern with the aid of a current-sensitive recording element having a higher amplification factor than is now available in conventional electrophotography.

Briefly stated, the novel apparatus for making a recording of an electrostatic charge pattern comprises an array of a plurality of field-effect devices. The charge pattern is applied adjacent to one face of the array, and a current-sensitive recording element is applied against an opposite face of the array. Means in circuit with the field-effect devices cause current to flow in each of these devices, in accordance with the intensity of each elemental portion of the charge pattern, and the current affects the recording element to change it in accordance with the intensity of the current.

The novel apparatus will be described with the aid of the accompanying drawings in which:

FIG. 3 is a fragmentary side elevational view, in cross section, of another embodiment of the novel apparatus embodying the present invention; and FIG. 4 is a fragmentary side elevational view, in cross section and partly schematic, of the novel apparatus for developing a dipolar electrostatic charge pattern, in accordance with the present invention.

Figure 1:
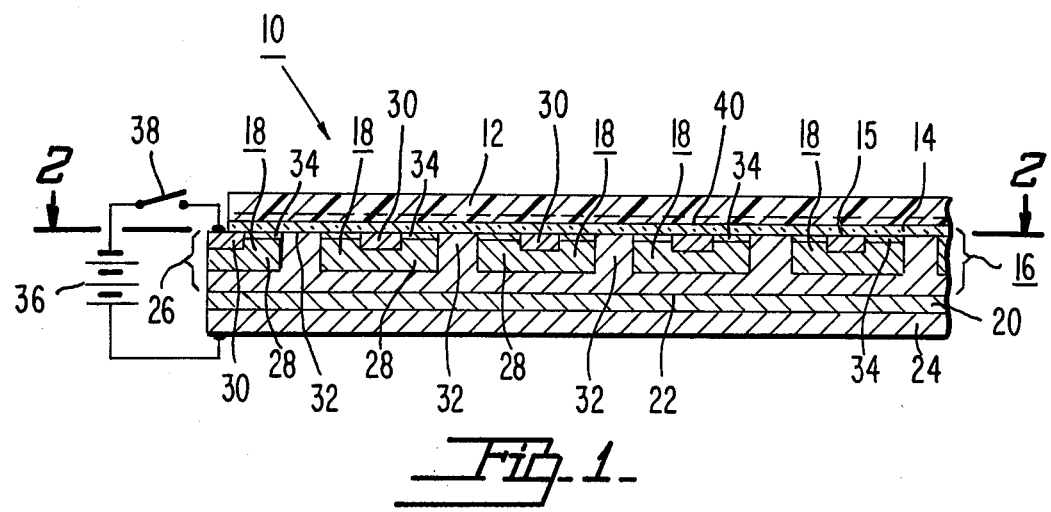
FIG. 1 is a fragmentary side elevational view of one embodiment of the novel apparatus in cross section and partly schematic, during the recording of a monopolar electrostatic charge pattern with the aid of a current-sensitive recording element, in accordance with the present invention.
Figure 2:
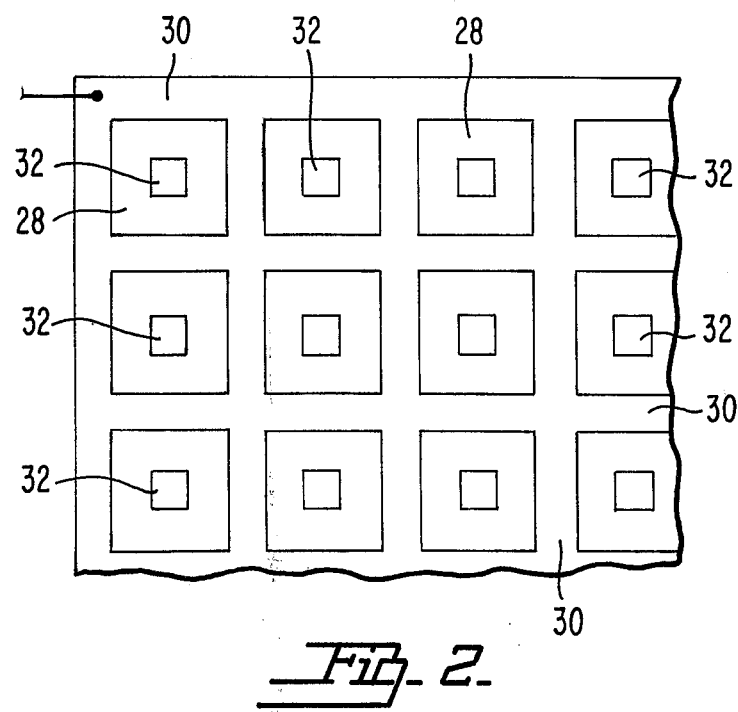
FIG. 2 is a fragmentary cross-sectional view, taken along the line 2—2 in FIG. 1, and viewed in the direction of the arrows.

Referring now to FIGS. 1 and 2 of the drawing, there is shown novel apparatus 10, in one embodiment thereof, for making a recording of an electrostatic charge pattern on an electrically insulating film 12. The film 12 is disposed against an electrically insulating layer 14 on an (upper) face 15 of an array 16 of a plurality of regularly arranged field-effect devices 18. A current-sensitive recording element 20 is disposed against a (lower) face 22 of the array 16 by means of a conductive sheet 24.

The insulating film 12 may comprise a sheet of plastic electrically insulating material, such as acrylic, polystyrene polytetrafluoroethylene, or polyethyleneterephthalate material, having a thickness of between about 10 and 650 $\mu$m, for example. The electrostatic charge pattern to be recorded can be formed on the film 12 by any means well known in the prior art, as, for example, described in the aforementioned U.S. Pat. No. 3,872,480. The film 12 is disposed against the insulating layer 14 with the electrostatic charge pattern closest to the array 16. The electrically insulating layer 14 may comprise silicon dioxide, aluminum oxide, or silicon nitride, for example.

The array 16, comprising the plurality of regularly arranged field-effect devices 18, comprises a layer or wafer 26 of semiconductor material. The field-effect devices 18 are formed in the wafer 26 by photolithograhic means well known in the integrated circuit semiconductor manufacturing art.

The wafer 26 of semiconductor material can be of either P type or N type conductivity (P type illustrated in FIG. 1), having a carrier concentration of about $2\times10^{16}$ /cm$^3$, for example. A plurality of opposite type conductivity (N type) dopant diffusions are made in the wafer 26 to form regions 28, having a thickness of about 20 $\mu$m. A plurality of (P type) source and drain regions 30 and 32, respectively, are diffused into the wafer 26 to form the field-effect devices 18. The carrier concentration of the dopants diffused into the source and drain regions 30 and 32 should be about $10^{20}$ /cm$^3$.

In order to maintain a good resolution of the image of the electrostatic charge pattern to be recorded on the current-sensitive recording element 20, the wafer 26 should not be thicker than about 100 $\mu$m. The distance between adjacent drain regions 32 should be no more than about 100 $\mu$m, the size of an elemental portion of the image to be recorded on the recording element 20. Hence, for a recorded image with about 500 × 500 elements (which is considered fairly good amateur photographic resolution, and substantially equivalent to a commercial TV image), the wafer 26 can have the dimensions of about 5cm by 5cm. The field-effect devices 18 can be easily manufactured on the wafer 26 with the aforementioned dimensions by commericial methods well known in the integrated circuit semiconductor manufacturing art.

The source regions 30 of the field-effect devices 18 are connected to each other and form a regularly arranged grid pattern, as shown in FIG. 2. Channel regions 34 are formed in the N type regions 28 of each of the field-effect devices 18. Hence, each of the field-effect devices 18 can be considered a field-effect transsistor wherein the insulating layer 14 is the gate insulator or dielectric. The gate voltage applied to each of the channel regions 34 of the field-effect devices 18 in an elemental portion of the electrostatic charge pattern on the film 12.

The current-sensitive recording element 20 may comprise any suitable or preferred material affected by current, such as material adapted to change color in response to the passage of electrical current therethrough. To this end, the recording element 20 may be impregnated with any desired substance having color responsive characteristics, the color change in the material being accomplished by the alteration of the pH characteristic of the material in response to the flow of electrical current therethrough. Numerous substances having such characteristics are well known. A suitable recording element 20, for example, can be produced by treating a sheet of preferably white paper with a solution of sodium chloride and phenophthalien. Such treated paper will turn a reddish color upon exposure to electrical current, the density of the color being substantially proportional to the quantity of current to which it is exposed. A sheet of paper treated with potassium iodide and starch will turn black. The color change thus accomplished in the recording element 20 may be the result either of the oxidation or the reduction of the chemical substance in the sheet. The conductive sheet 24, holding the recording element 20 against the lower face 22 of the array 16 can be of any suitable electrically conductive metal, such as copper, iron, or stainless steel, for example.

Means are connected to the source and drain regions 30 and 32 of each of the devices 18 to cause current to flow through the drain regions 32 and through the recording element 20 in response to elemental portions of the electrostatic charge pattern adjacent the respective channel regions 34, of the devices 18. To this end, a negative terminal of a source 36 of voltage is connected to the source regions 30 through a single pole-single-throw switch 38, and a positive terminal of the voltage source 36 is connected to the conductive sheet 24, as shown in FIG. 1.

The operation of the novel apparatus 10, in accordance with the present invention, will now be explained wth reference to FIGS. 1 and 2 of the drawing. The electrostatic charge pattern, shown in FIG. 1 as a monopolar charge is disposed against the upper surface 40 of the insulating layer 14, that is, adjacent to the upper face 15 of the array 16. The recording element 20 is disposed against the lower face 22 of the array 16. The switch 38 is closed, applying the source 36 of voltage between the source and drain regions 30 and 32 and all of the field-effect devices 18. Since the current-sensitive recording element 20 is disposed against the lower face 22 of the array 16 by means of the sheet 24, each elemental portion of the electrostatic charge pattern adjacent each of the channel regions 34 of each of the devices 18 causes current to flow between the source and drain regions 30 and 32 of each of these devices 18 in accordance with the intensity of the charge adjacent the respective channel region 32 of the device 18. The current flowing through each of the drain regions 32 also flows through the current-sensitive recording element 20 and through the conductive sheet 24 back to the voltage source 36. The current flowing through the recording element 20 causes the latter to change color in accordance with the intensity of the current flowing therethrough. Because the array 16 of field effect devices 18 is relatively thin, most of the current flowing through the drain regions 32 flows through the recording element 20, and the conductive sheet 24 because the resistivity of the wafer 26 is relatively higher than that of the current-sensitive recording element 20 and the conductive sheet 24.

In practice, the electrostatic charge pattern on the insulating film 12 can be stored for a relatively long period of time, as, for example, for many months. The charge density of the electrostatic charge pattern on the insulating film 12 is typically of the order of $10^{10}$ to $10^{11}$ charges/cm$^2$. If, for example, the source 36 of voltage is about 100 volts between the source and drain regions 30 and 32, the aforementioned charge density will give rise to a current of about $10^{-4}$ to $10^{-5}$ amperes, assuming a charge mobility of about 1000cm$^2$/Vsec. If the thickness of the wafer 26 is between 1000 and 10,000A, one atom or one molecule is deposited for each transported elementary charge, and a development time of about 100 seconds is calculated from the aforementioned current and the wafer thickness.

The array 16 of field-effect devices 18, illustrated in FIGS. 1 and 2, is relatively thin and fragile. A more rigid and preferred array 16a is shown in FIG. 3. Similar reference numerals in the arrays 16 and 16a refer to similar parts. The array 16a comprises a substrate 42 of an electrically insulating material, such as sapphire, spinel, or beryllium oxide, for example. The substrate 42 is formed with a plurality of regularly spaced holes 44 extending between the major surfaces thereof. The holes 44 are spaced about 100 $\mu$m apart. The holes 44 may be formed in the substrate 42 by laser drilling or chemical etching, for example, and each of the holes 44 should be about 20 $\mu$m in diameter. A layer 45 of semiconductor material, such as of silicon or germanium, for example, is deposited upon the upper surface 46 of the substrate 42. The layer 45 of semiconductor material, preferably of silicon, is preferably deposited epitaxially upon the surface 46 of chemical vapor deposition, in a manner well known in the semiconductor device manufacturing art. The conductivity of the layer 45 in FIG. 3 is illustrated as N type, (but it may also be P type) and can have a thickness of between about 1 and 10 $\mu$m. Source and drain regions 30 and 32, respectively, are now diffused into the layer 45. The P type drain regions 32 can be diffused through the holes 44 in the insulating substrate 42. The source regions 30 for the field-effect devices 18 are in the form of the grid structure shown in FIG. 2 so that the source region 30 in each of the devices 18 surrounds a single drain region 32.

In each of the field-effect devices 18, a channel region 34 is formed between the source and drain regions 30 and 32. By photolithographic means well known in the semiconductor device manufacturing art, a coating or conductive layer 48 of a metal, such as aluminum, for example, is coated on the portions of the insulating substrate 42 that define each of the holes 44. The conductive layers 48 are in contact with the drain regions 32 of the field-effect devices 18. The source and drain regions 30 and 32, as well as the channel regions 34 of each of the field-effect devices 18 extend to the upper surface 50 of the semiconductor layer 45. A protective layer 52 of electrically insulating material, such as of silicon dioxide or silicon nitride, for example, is deposited over the upper face 50 of the semiconductor layer 45 and functions as a gate dielectric for each of the field-effect devices 18.

In operation, the array 16a (FIG. 3) functions like the array 16 (FIG 1) and can be substituted for the array 16 in the circuit shown in FIG. 1. In addition to being stronger than the array 16 of FIG. 1, the array 16a of FIG. 3 can provide an image of the electrostatic charge pattern on the current-sensitive recording element 20 with improved resolution. The reason for this is that current flowing through each of the drain regions 32 flows back directly to the voltage source 36 via the metal layers 48. Such current flow substantially reduces or eliminates lateral conduction in the field-effect devices 18, resulting in a sharper recorded image on the recording element 20.

Referring now to FIG. 4 of the drawing, the apparatus 10 is shown substantially as in FIG. 1, but additional circuit means are provided to record an electrostatic charge pattern that is in a dipole form on the insulating film 12. In FIG. 4, the source regions 30 of each of the field-effect devices 18 are connected to an armature 54 of single-pole double-throw switch 56. One contact 58 of the switch 56 is connected to a common connection, such as ground. Another contact 60 of the switch 56 is connected to the negative terminal of the source 36 of voltage. The positive terminal of the voltage source 36 is also connected to the common terminal, ground, and to an armature 62 of a single-pole double-throw switch 64. One contact 66 of the switch 64 is connected to drain regions 32 of the field-effect devices 18, and another contact 68 is connected to the conducitve sheet 24.

A dipolar electrostatic charge on the film 12 is recorded on the current-sensitive recording element 20 in the following manner: The armatures 54 and 62 of the switches 56 and 64 are first connected to the contacts 58 and 66, respectively, as shown in FIG. 4. The entire upper surface 70 of the insulating film 12 is now wiped with a grounded wetted sponge 72, moved in the direction of the arrow 74. If the capacitance of the film 12 and of the insulating layer 14 are equal, then half of the electrostatic charge from the free surface 70 of the film 12 will flow through the interface of the insulating layer 14 and the upper face 15 of the wafer 26. Under these conditions the conductivity in each of the channel regions 34 is increased. Obviously, if the capacitance of the insulating layer 14 is much larger than that of the film 12, most of the electrostatic charge can be transferred to the interface between the wafer 26 and the insulating layer 14. Next, the armatures 54 and 62 of the switches 56 and 64 are moved to the positions represented by the dotted lines (FIG. 4) to connect with the contact 60 and 68, respectivey. Under these conditions the source 36 of voltage is connected to the apparatus 10 in the same manner indicated for the circuit in FIG. 1. Hence, each of the elemental portions of the charge pattern on the insulating film 12, adjacent respective channel regions 34 causes current to flow in the respective devices 18 so as to affect elemental portions of the recording element 20 and to thereby record the electrostatic image in visible form on the recording element 20. As explained for the operation of the apparatus 10 in FIG. 1.

While the field-effect devices 18 have been described as P channel field-effect devices, it is obvious to one skilled in the art that these devices may also be N type channel devices. The polarity of the electrostatic charge pattern to be recorded will determine the conductivity type of the devices 18 to be employed.

What is claimed is:

1. Apparatus for making a recording of an electrostatic charge pattern disposed on an electrically insulating film comprising:
   an array of a plurality of field-effect devices,
   each of said devices comprising source and drain regions of one conductivity type separated from each other by a channel region of the opposite conductivity type adjacent one face of said array,
   means to dispose said charge pattern adjacent to said one face,
   means to apply a current-sensitive recording element adjacent an opposite face, to said one face, of said array, and
   means in circuit with said source and drain regions to cause current to flow in each of said devices in accordance with the intensity of each elemental portion of said charge pattern adjacent a respective channel region of each of said devices whereby said current can flow through said recording element to change it in accordance with its intensity.

2. Apparatus for making a recording of an electrostatic charge pattern as described in claim 1, wherein:
   said means to dispose said charge pattern adjacent to said one face comprise an electrically insulating layer on said one face, said insulating film being adapted to be disposed over said insulating layer.

3. Apparatus for making a recording of an electrostatic charge pattern as described in claim 1, wherein:
   said array comprises a layer of semiconductor material,
   said field-effect devices are formed in said layer, and
   portions of said source, drain, and channel regions are adjacent a surface of said layer.

4. Apparatus for making a recording of an electrostatic charge pattern as described in claim 1, wherein:
   said means to apply a current-sensitive recording element adjacent an opposite face of said array comprise an electrically conductive sheet disposed against one surface of said recording element while an opposite surface of said recording element is disposed against said opposite face of said array.

5. Apparatus for making a recording of an electrostatic charge pattern as described in claim 1, wherein:
   said means in circuit with said source and drain regions comprise means to apply a source of voltage, and
   said current-sensitive recording element comprises means to change color when an electrical current flows therethrough, the amount of color change varying with the intensity of the current.

6. Apparatus for making a recording of an electrostatic charge pattern as described in claim 1, wherein:
   said array comprises a substrate of an insulating material, a layer of semiconductor material deposited on one surface of said substrate, and said field-effect devices formed in said layer of semiconductor material,
   said substrate being formed with a plurality of holes therethrough, and each of said drain regions being adjacent, and communicating with, a respective one of said holes, and
   an electrically conductive layer in each of said holes making electrical contact with an adjacent drain region and extending to an opposite surface, to said one surface, of said substrate.

7. Apparatus for making a recording of an electrostatic charge pattern as described in claim 6, wherein:
   said substrate is sapphire, said layer of semiconductor material is an epitaxial deposition of silicon on said sapphire, and said source regions of said field-effect devices comprise a substantially regular grid-like structure wherein each of said source regions surrounds a separate drain region in each of said devices, and said current-sensitive recording element is adapted to physically contact each of said conductive layers on said opposite surface of said substrate.

* * * * *